(12) United States Patent
Weinberger et al.

(10) Patent No.: US 12,126,048 B2
(45) Date of Patent: Oct. 22, 2024

(54) BATTERY MODULE WITH FLEXIBLE INTERCONNECTOR

(71) Applicant: Samsung SDI Co., Ltd., Yongin-si (KR)

(72) Inventors: Martin Weinberger, Maria Saal (AT); Ralph Wuensche, Graz (AT); Michael Erhart, Seiersberg-Pirka (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 191 days.

(21) Appl. No.: 17/033,734

(22) Filed: Sep. 26, 2020

(65) Prior Publication Data

US 2021/0098765 A1    Apr. 1, 2021

(30) Foreign Application Priority Data

Sep. 30, 2019  (EP) .................................... 19200501
Aug. 10, 2020  (KR) ...................... 10-2020-0100005

(51) Int. Cl.
*H01M 10/643*    (2014.01)
*H01M 10/6553*   (2014.01)
(Continued)

(52) U.S. Cl.
CPC ....... *H01M 50/502* (2021.01); *H01M 10/643* (2015.04); *H01M 10/6553* (2015.04);
(Continued)

(58) Field of Classification Search
None
See application file for complete search history.

(56) References Cited

U.S. PATENT DOCUMENTS

| | | |
|---|---|---|
| 2011/0269008 A1* | 11/2011 | Houchin-Miller ........................ H01M 50/244 429/120 |
| 2012/0148876 A1 | 6/2012 | Zeng et al. |

(Continued)

FOREIGN PATENT DOCUMENTS

| | | |
|---|---|---|
| EP | 2 804 284 A2 | 11/2014 |
| EP | 2 989 676 B1 | 3/2017 |

(Continued)

OTHER PUBLICATIONS

Extended European Search Report for corresponding European Application No. 19200501.5, dated May 7, 2020, 9 pages.

(Continued)

*Primary Examiner* — Amanda J Barrow
(74) *Attorney, Agent, or Firm* — LEWIS ROCA ROTHGERBER CHRISTIE LLP (57) ABSTRACT

A battery module includes: a plurality of aligned battery cells having differently-oriented surfaces; a cell supervision circuit (CSC) configured to receive signals corresponding to the voltage and/or temperature of at least one of the battery cells; and a flexible interconnector comprising a strip-shaped flexible printed circuit (FPC). The FPC includes a first insulating main surface, a second insulating main surface opposite the first insulating main surface, and a plurality of thermally and/or electrically conducting lines between the first insulating main surface and the second insulating main surface. Each of the conducting lines has a contact portion exposed by a contact aperture in the first insulating main surface and/or in the second insulating main surface and a connecting portion for connection to the CSC, and the flexible interconnector wraps around the battery cells such that the contact portions contact the differently-oriented surfaces of the battery cells.

11 Claims, 9 Drawing Sheets

(51) Int. Cl.
 *H01M 50/15* (2021.01)
 *H01M 50/502* (2021.01)
 *H05K 1/18* (2006.01)

(52) U.S. Cl.
 CPC ............ *H01M 50/15* (2021.01); *H05K 1/189* (2013.01); *H01M 2200/105* (2013.01); *H05K 2201/10037* (2013.01)

(56) References Cited

U.S. PATENT DOCUMENTS

| | | | |
|---|---|---|---|
| 2014/0342191 A1* | 11/2014 | Shin | H02J 7/007194 429/7 |
| 2014/0356651 A1* | 12/2014 | Ciaccio | H01M 50/569 429/7 |
| 2014/0370343 A1 | 12/2014 | Nomoto et al. | |
| 2016/0043446 A1 | 2/2016 | Fritz et al. | |
| 2016/0372796 A1 | 12/2016 | Nishihara | |
| 2017/0271642 A1 | 9/2017 | Groshert et al. | |
| 2017/0370343 A1 | 12/2017 | Phan et al. | |
| 2019/0131672 A1* | 5/2019 | Stafl | H01M 50/505 |
| 2019/0214606 A1* | 7/2019 | Kurcik | H01M 50/271 |
| 2019/0237817 A1 | 8/2019 | Hammerschmied et al. | |

FOREIGN PATENT DOCUMENTS

| | | |
|---|---|---|
| EP | 3 316 384 A1 | 5/2018 |
| EP | 3 435 048 A1 | 1/2019 |
| KR | 10-2014-0139402 A | 12/2014 |
| WO | WO 2012/075948 A1 | 6/2012 |

OTHER PUBLICATIONS

EP Office action issued in corresponding application No. EP 19 200 501.5, dated Sep. 23, 2021, 4 pages.

European Office action issued in corresponding application No. EP 19 200 501.5, dated Mar. 3, 2021, 6 pages.

* cited by examiner

BATTERY MODULE WITH FLEXIBLE INTERCONNECTOR

CROSS-REFERENCE TO RELATED APPLICATION

This application claims priority to and the benefit of European Patent Application No. 19200501.5, filed in the European Patent Office on Sep. 30, 2019, and Korean Patent Application No. 10-2020-0100005, filed in the Korean Intellectual Property Office on Aug. 10, 2020, the entire content of both of which are incorporated herein by reference.

BACKGROUND

1. Field

Aspects of embodiments of the present invention relate to a battery module with a flexible interconnector.

2. Technological Background

A rechargeable (or secondary) battery differs from a primary battery in that it is designed to be repeatedly charged and discharged, while the latter provides an irreversible conversion of chemical to electrical energy. Low-capacity rechargeable batteries may be used as a power supply for electronic devices, such as cellular phones, notebooks, and camcorders, while high-capacity rechargeable batteries may be used as a power supply for hybrid vehicles or the like.

In general, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction between the positive electrode, the negative electrode, and the electrolyte solution. The shape of the case, for example, a cylindrical or rectangular shape, depends on the battery's intended purpose.

Rechargeable batteries may be used as (or used in) a battery module formed of a plurality of battery cells coupled to each other in series and/or in parallel to provide a high energy density, such as for motor driving of a hybrid vehicle. For example, a battery module may be formed by interconnecting the electrode terminals of the plurality of unit battery cells, the number of which is determined based on a desired amount of power, to realize a high-power rechargeable battery, such as for an electric vehicle.

Battery modules can be constructed using either a block design or a modular design. In the block design, each battery cell is coupled to a common current collector structure and a common battery management system. In the modular design, pluralities of battery cells are connected to each other to form submodules, and several submodules are connected to each other to form the battery module. Battery management functions may be realized either on the module or submodule level, and thus, interchangeability of the components is improved. One or more battery modules may be mechanically and electrically integrated, equipped with a thermal management system, and set up for communication with electrical consumers to form a battery system.

A battery system may include a thermal management system to provide thermal control of the battery system and ensure safe operation of the battery module(s) by efficiently emitting, discharging, and/or dissipating heat generated from its rechargeable batteries. If the heat emission/discharge/dissipation is insufficient, temperature deviations occur between respective battery cells, such that the corresponding battery module may no longer generate a desired amount of power. In addition, an increase in the internal temperature of the battery cells can lead to abnormal reactions occurring therein, and thus, charging and discharging performance of the rechargeable battery deteriorates and the life-span of the rechargeable battery is shortened. Thus, cooling devices for effectively emitting/discharging/dissipating heat from the cells are often employed.

A static control of battery power output and charging may not be sufficient to meet the dynamic power demands of various electrical consumers connected to the battery system. Thus, steady exchange of information between the battery system and the controllers of the electrical consumers may be used. This information includes the battery system's actual state of charge (SoC), potential electrical performance, charging ability, and internal resistance as well as actual or predicted power demands or surpluses of the consumers. Battery systems usually include a battery management system (BMS) for processing this information.

The BMS is usually coupled to the controller of one or more electrical consumers as well as to each of the battery modules in the battery system. A daisy chain setup may be used so that a single BMS can control a plurality of battery modules. In such a setup, the BMS, as master, is connected for communication in series to a plurality of battery modules, for example, to a plurality of cell supervision circuits (CSC) of the respective battery modules. The BMS is configured to receive and process information of each of the CSCs as well as that of external consumers or control units, such as a vehicle board net, connected thereto. Further, each of the CSCs is configured to detect voltages and/or temperatures of an individual battery module and to communicate the detected voltages and/or temperatures to the BMS.

To connect the CSC with the individual battery cells in a battery module, various electrical conductor paths for voltage measurement and control and for temperature measurement are used in conventional designs for cell voltage and temperature instrumentation. These electrical conductor paths are usually provided by a wire harness with crimped contact terminals for an interface to the CSC on one end and with an interface to be soldered, welded, or riveted to the busbars on the other end. Such wire harnesses usually need to be held in position by a plastic carrier to which the harness is usually wire-by-wire attached. Thus, the installation and/or mounting of the wire harness is a time consuming step in the manufacturing process of the battery module. Further, the carrier and/or a frame for the wire harness adds additional components to the battery module.

SUMMARY

According to embodiments of the present invention, at least some of the drawbacks of the prior art are overcome or mitigated and an apparatus and method for connecting the individual cells of a battery module or system to a cell supervision circuit that can be easily and cost-effectively assembled during the manufacturing process, which reduces the total component count, is provided.

According to an embodiment, a battery module is provided that includes a plurality of aligned battery cells, and each of the battery cells may include a cell case, a negative cell terminal, and a positive cell terminal. The batteries may be aligned such that individual batteries or subsets of batteries can be connected to each other via busbars. For example, a plurality of prismatic battery cells may be aligned in a lengthwise direction such that their wide side surfaces face each other, or a plurality of cylindrical battery cells may be aligned such that their lateral surfaces face each other. In some embodiments, the plurality of aligned battery cells may be variously oriented, for example, with different surfaces facing into different directions. For example, the individual battery cells as well as the plurality of aligned battery cells have a plurality of surfaces, and normal vectors of these surfaces point in different directions. Thus, the battery module may have a complex, non-regular geometry.

The battery module, according to embodiments of the present invention, further includes a cell supervision circuit (CSC) that is configured to receive signals corresponding to the voltage and/or temperature of at least one battery cell of the battery module. The CSC may include a microprocessor, ASIC, or any suitable (integrated) circuit that is configured to receive signals corresponding to the voltage and/or temperature of at least one battery cell of the battery module. In some embodiments, the CSC is further configured to process, analyze, and/or store the received signals, and the CSC may be further configured to transmit signals related to the received signals to a battery management system (BMS). The CSC may be configured to perform at least one control function with respect to the battery module and/or with respect to at least one battery cell thereof. The control functions may include measurements or determinations of cell voltages, cell currents, cell resistances, and/or cell capacities and may further include the active or passive balancing of cell voltages or cell currents of battery cells in the battery module.

The battery module according to embodiments of the present invention further includes a flexible interconnector including a strip-shaped flexible printed circuit (FPC). The strip-shaped FPC has a lengthwise extension that exceeds the width of the FPC significantly (e.g., the strip-shaped FPC primarily extends in a lengthwise direction), and the FPC may have a length-to-width ratio of at least about 5:1, about 10:1, about 50:1, or greater. Further, the width of the FPC exceeds the height (e.g., thickness) thereof significantly, for example, by a ratio of at least about 2:1, about 5:1, about 20:1, or greater. The FPC may include a flexible plastic substrate including (or made of), for example, a polyimide, polyether ether ketone (PEEK), or polyester, with conducting structures, such as metallizations or conductive polymers, disposed on or in the flexible substrate.

The FPC has a first insulating main surface and a second insulating main surface opposite the first insulating main surface. Each of the main surfaces spans the length direction and the width direction of the FPC. Further, the insulating main surfaces may be formed by respective layers of the FPC laminated onto each other or may be formed as a monolithic body of the FPC, for example, molded or cast from an insulating substrate. The FPC further includes a plurality of thermally and/or electrically conducting lines that are disposed between the first insulating main surface and the second insulating main surface. Each of the conducting lines is thermally and electrically conducting (or conductive). However, a first subset (e.g., a first group) of the conducting lines may be primarily electrically conducting, and a second subset (e.g., a second group) of conducting lines may be primarily thermally conducting. According to another embodiment, all of the conducting lines are electrically conducting (e.g., all of the conducting lines are primarily electrically conducting).

According to embodiments of the present invention, each of the conducting lines may have at least one contact portion that is exposed by (or exposed through) a contact aperture in the first insulating main surface and/or in the second insulating main surface. Further, each of the conducting lines has at least one connecting portion for connection to the CSC. For example, each of the conducting lines is covered by the insulating main surfaces, which is an insulating material, of the FPC except at the at least one contact portion and the at least one connecting portion. In some embodiments, each or at least some of the conducting line have only one contact portion. Also, in some embodiments, each or at least some of the contact portions may be exposed by a contact aperture in only one of the first and second insulating main surfaces. The contact apertures are configured to allow for electric and/or thermal contact between the respective conducting line and a surface of a battery cell and/or another part of the battery module on which the FPC is disposed. For example, the electric and/or thermal contact is provided or at least enhanced by an additional contact structure, such as, for example, solder, braze, or the like.

According to embodiments of the present invention, the flexible interconnector is wrapped around the plurality of aligned battery cells such that the contact portions contact the surfaces in different orientations of the plurality of aligned battery cells (e.g., contact the differently-oriented surfaces of the plurality of aligned battery cells). For example, the flexible interconnector may be curved to be adapted to the surfaces in different orientation, for example, adapted to the non-regular geometry of the plurality of aligned battery cells of the battery module. Hence, the flexible interconnector, including the FPC, has at least one but, in some embodiments, a plurality of bends, which follow a surface of at least one battery cell or another component of the battery module. Thus, the FPC is disposed above a plurality of the surfaces with different orientations of the battery cells and faces the respective surface via one of the insulating main surfaces. Further, the conducting lines in the FPC are in electric and/or thermal contact with the plurality of differently-oriented surfaces of the battery cells (e.g., the battery module) via at least one contact aperture in the respective insulating main surface.

In one embodiment, the FPC is wrapped (e.g., wound or coiled) around the battery module such that all of the components of the battery module that are to be electrically and/or thermally connected with the CSC are contacted by at least one conducting line of the FPC via a contact aperture. For example, the flexible interconnector is configured to provide all electrical connections between the CSC and components of the battery module that are to be monitored by the CSC. The battery module according to embodiments of the present invention thus provides a new apparatus and method for interconnecting the measurement points for voltage and/or temperature measurements of the battery module, for example, across battery cells, busbars, heat exchangers, and/or the like with the CSC. According to embodiments of the present invention, only a single component is wrapped around the battery module such that contact apertures are aligned with the desired measurement spots of the battery module. The battery module according to embodiments of the present invention can be more easily manufactured than conventional battery modules while decreasing the component count and costs of manufacture.

In one embodiment, the flexible interconnector is wrapped around cylindrical battery cells such that the contact portions contact base surfaces and lateral surfaces of the cylindrical battery cells. For example, the flexible interconnector contacts the base surfaces of a first subset of the battery cells and the lateral surfaces of a second subset of the battery cells. According to this embodiment, the battery module includes cylindrical battery cells (e.g., includes only cylindrical battery cells), each having a pair of opposing base surfaces connected to each other by a lateral surface. In one embodiment, the base surfaces of the battery cells have a cylindrical or elliptical shape. While the base areas (or base surfaces) of the plurality of battery cells may be aligned, the lateral surfaces of the battery cells may have different orientations with respect to each other as well as with respect to the base surfaces. However, the plasticity and flexibility of the flexible interconnector allows for it to be wrapped around the battery cells such that it can electrically and/or thermally contact a variety of these surfaces even when they have different orientations. Further, the flexible interconnector may be thread through (or between) different ones of the battery cells, thereby allowing electrical and thermal contact with even inner battery cells from among the plurality of battery cells.

According to another embodiment, the battery cells are prismatic battery cells, and each battery cell includes a cell case and a cap assembly placed on the cell case. The flexible interconnector is wrapped around the prismatic battery cells such that contact portions contact the cell cases and the cap assemblies of the prismatic battery cells. For example, the flexible interconnector contacts the cell cases of a first subset of the battery cells and the cap assemblies of a second subset of the battery cells. According to this embodiment, the battery module includes prismatic battery cells (e.g., includes only prismatic battery cells), each having a cell case with one open base area and a cap assembly closing (or sealing) the cell case. The prismatic cells may be aligned such that wide side surfaces face each other, while the side surfaces that do not face each other as well as the cap assemblies face in different directions. However, the plasticity and flexibility of the flexible interconnector allows for it to be wrapped around the battery cells such that it can contact a variety of these differently-oriented surfaces. Further, the flexible interconnector may be thread through (or between) different battery cells, hence allowing to electrically and thermally contact even inner battery cells of the plurality of battery cells.

According to another embodiment of the present invention, the battery module includes a heat exchanger that is in thermal contact with the plurality of battery cells, and the flexible interconnector is wrapped around battery cells and around the heat exchanger such that contact portions contact battery cells and the heat exchanger. For example, a plurality of contact portions contact the battery cells and at least one contact portion contacts the heat exchanger. Further, the battery module may include a plurality of heat exchangers, and each heat exchanger is contacted by at least one contact portion. The heat exchangers of the battery module may be a base plate or a top cover with an integrated cooling element. However, other heat exchanger configurations, for example, heat exchangers disposed between the cells, are contemplated as well.

The battery module may further include a plurality of busbars, and each busbar may interconnect cell terminals of at least two battery cells. The flexible interconnector wraps around the battery cells and around the busbar(s) such that contact portions contact battery cells and the busbar. Some of the busbars interconnect cell terminals having different polarity, that is, connect battery cells to each other in series. Other busbars interconnect cell terminals having the same polarity, that is, connect battery cells to each other in parallel. Further, the busbars may connect battery cells to each other in series and in parallel. The busbars may be disposed on top surfaces or on cap assemblies of the prismatic battery cells or may be disposed on base surfaces of the cylindrical battery cells. A plurality of contact portions contact the battery cells, and a plurality of contact portions contact the busbars. In some embodiments, the busbars are contacted to measure cell voltages, and the cells may be contacted to measure temperatures.

In another embodiment, the connecting portions of at least some of the conducting lines are arranged at a terminal end of the strip-shaped FPC. For example, the conducting lines may extend over the insulating main surfaces at a terminal end of the FPC to be electrically connected to the CSC by soldering, brazing, or welding. In another embodiment, at least some and, in some embodiments, each of the conducting lines extends across the entire length of the strip-shaped FPC and includes a first connecting portion at a first terminal end and a second connecting portion at a second terminal end. The conducting lines may extend over the insulating main surfaces at both terminal ends of the FPC to be electrically connected to the CSC by soldering, brazing, or welding. Thus the CSC provides a closed electric connection to, for example, measure a voltage drop along the conducting line according to a thermistor located at a contact portion thereof. Also, the flexible interconnector may further include at least one connector plug that is attached to at least one terminal end of the strip-shaped FPC, and the connector plug may be connected to at least some (or all) of the conducting lines of the FPC, such as to that terminal ends thereof. The connector plug is configured to be electrically connected to the CSC by, for example, providing a plurality of contact pins configured to be connected to the conducting pins and to be connected to pin sockets of the CSC.

According to another embodiment, the connecting portions of at least some of the conducting lines are arranged at a center part of the strip-shaped FPC. For example, center parts of the strip-shaped FPC are configured to be connected to the CSC to provide an electrical connection with the CSC, for example, with a landing pad on the CSC. Different conducting lines of the flexible interconnector may be configured to be connected to different components of the CSC to provide signals to different elements of the CSC. For example, the same flexible interconnector may be connected to different landing pads on a CSC along a length of the flexible interconnector by contact pads in the center part of the FPC.

Each of the contact apertures may expose one or a subset of conducting lines. Hence, a single (e.g., only a single) conducting line may be used to measure the voltage at a contact portion or a plurality of conducting lines may be used to measure voltage and/or temperature at a contact portion. Using a plurality of conducting lines provides redundancy and/or may allow for measurement of higher currents and/or voltages at a measurement point connected to the contact portion. However, in many embodiments, exposing a single conducting line at a respective contact portion will be sufficient to measure voltages and/or temperatures at that contact portion. Further, using only a single conducting line allows for measuring a maximum number of contact portions.

According to another embodiment of the present invention, a first subset of conducting lines measure electric voltages at the respective contact portions (e.g., at contact portions exposing the conducting lines of the first subset of conducting lines), and a second subset of conducting lines measure temperatures at the respective second contact portions (e.g., at the contact portions exposing the conducting lines of the second subset of conducting lines). According to this embodiment, subsets (e.g., defined subsets) of conducting lines are used to measure voltages and temperatures, respectively. The voltages may be measured by providing the electric potential at the respective measurement point (e.g., the contact portion) to a respective sensor input at the CSC.

The temperatures may be measured via the second subset of conducting lines by conducting the respective temperature level via the respective conducting line to a respective input of a temperature sensor at the CSC. By considering the thermal propagation properties and the length of the conducting line between the input and the contact portion, the temperature at the contact portion can be derived from the temperature of the conducting line at the CSC.

According to another embodiment, temperature at a contact portion may be measured via a voltage drop at a thermistor positioned at the contact portion of the conducting line. According to this embodiment, the contact portions of the second subset of conducting lines contact respective battery cells and other components of the battery module via thermistors. Hence, a voltage drop at the thermistor depends on (e.g., changes according to) a temperature at the contact portion, thereby enabling temperature measurements at the contact portions by applying a certain voltage potential to one terminal end of the conducting line and measuring the voltage drop at the other terminal end of the conducting line that is connected to the CSC. Hence, both terminal ends of the conducting line may be connected to the CSC.

Another embodiment of the present invention relates to a method for manufacturing a battery module according to the above-described embodiments. According to an embodiment of the method, a pre-module is provided that includes a plurality of aligned battery cells. Each of the battery cells may include a cell case, a negative cell terminal, and a positive cell terminal. The plurality of aligned battery cells have surfaces in different orientations as described above.

In another step of the method, a terminal end of a flexible interconnector is attached to the pre-module, and the flexible interconnector includes a strip-shaped flexible printed circuit (FPC) as described above. The attachment of the terminal end of the flexible interconnector occurs by, for example, an adhesive, such as an applied adhesive or a self-adhesive portion of the flexible interconnector. However, the attachment of the terminal end may also be carried out by a connector plug disposed at a terminal end of the flexible interconnector. In such an embodiment, the connector plug is connected to a CSC, for example, to a socket thereof, and the connector plug is secured at the CSC, such as at the socket. However, other methods of attaching the terminal end of the flexible interconnector are also envisioned, such as a connection provided between a hook and a loop or a push button.

The FPC may have a first insulating main surface, a second insulating main surface opposite the first insulating main surface, and a plurality of thermally and/or electrically conducting lines disposed between the first insulating main surface and the second insulating main surface as described above. Again, each conducting line includes one or more contact portions, each of which are exposed by a contact aperture in the first insulating main surface and/or in the second insulating main surface. In the method, the flexible interconnector, such as the FPC, is wrapped around the pre-module such that the contact portions contact the differently-oriented surfaces of the plurality of battery cells of the battery module.

In one embodiment, the pre-module is disposed on a rotation platform (e.g., a rotating platform) and the flexible interconnector is attached to the pre-module via a robot arm connected to a feeding machine providing the FPC. After the terminal end of the flexible interconnector is attached to the pre-module, the rotation platform is rotated and the FPC is provided by the feeding machine under tension to wrap the FPC tightly to the exterior surfaces of the battery cells such that the FPC is provided in close contact with the exterior surfaces of the pre-module, including between the contact portions and the differently-orientated surfaces.

In the method, the pre-module may include a cell supervision circuit (CSC) that is configured to receive signals corresponding to the voltage and/or temperature of at least one battery cell of the battery module. However, the CSC may also be applied to the pre-module after wrapping the flexible interconnector. Additionally or alternatively, the pre-module may include a heat exchanger that is in thermal contact with the plurality of battery cells, such as with a base plate and/or a top cover, and the heat exchanger may include a cooling device and/or cooling channel. Additionally or alternatively, the pre-module may include a busbar that interconnects cell terminals of at least two battery cells from among the plurality of aligned cells.

According to these embodiments, the flexible interconnector is wrapped around the pre-module such that contact portions of the FPC also contact the heat exchanger and/or the busbar while the terminal end of the flexible interconnector is attached to the CSC such that a connecting portion of the flexible interconnector is connected to the CSC. Thus, the CSC may be mounted to the pre-module after the flexible interconnector is mounted to the pre-module, for example, when the initial connection is by adhesive.

After the flexible interconnector is wrapped around the pre-module such that the contact portions contact the differently-oriented surfaces of the pre-module, the heat exchanger, and/or the busbar, the electric connections between the contact portions and the battery pre-module are provided (or formed or realized). For example, after the flexible interconnector is wrapped around the pre-module, the electrical connections might be provided by welding, stamping, brazing, and/or soldering. The electrical connections may be provided through the FPC, for example, between a contact portion in the first main insulating surface thereof and the battery pre-module by pressure and/or heat applied via the second main surface.

Further aspects and features of the present invention will be learned from the claims, the attached drawings, and the following description.

BRIEF DESCRIPTION OF THE DRAWINGS

Aspects and features of the present invention will become more apparent to those of ordinary skill in the art by describing, in detail, exemplary embodiments thereof with reference to the attached drawings, in which:

FIGS. 6(A) to 6(D) schematically illustrate steps of a method for manufacturing a battery module according to an embodiment.

DETAILED DESCRIPTION

Reference will now be made, in detail, to embodiments, examples of which are illustrated in the accompanying drawings. Aspects and features of the exemplary embodiments, and implementation methods thereof, will be described with reference to the accompanying drawings. The present invention, however, may be embodied in various different forms and should not be construed as being limited to the embodiments illustrated herein. Rather, these embodiments are provided as examples so that this disclosure will be thorough and complete and will fully convey the aspects and features of the present invention to those skilled in the art. Processes, elements, and techniques not considered necessary for those having ordinary skill in the art to have a complete understanding of the aspects and features of the present invention may not be described.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise. Expressions such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

As used herein, the terms "substantially," "about," and similar terms are used as terms of approximation and not as terms of degree and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the FIGS. is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Figure 1:
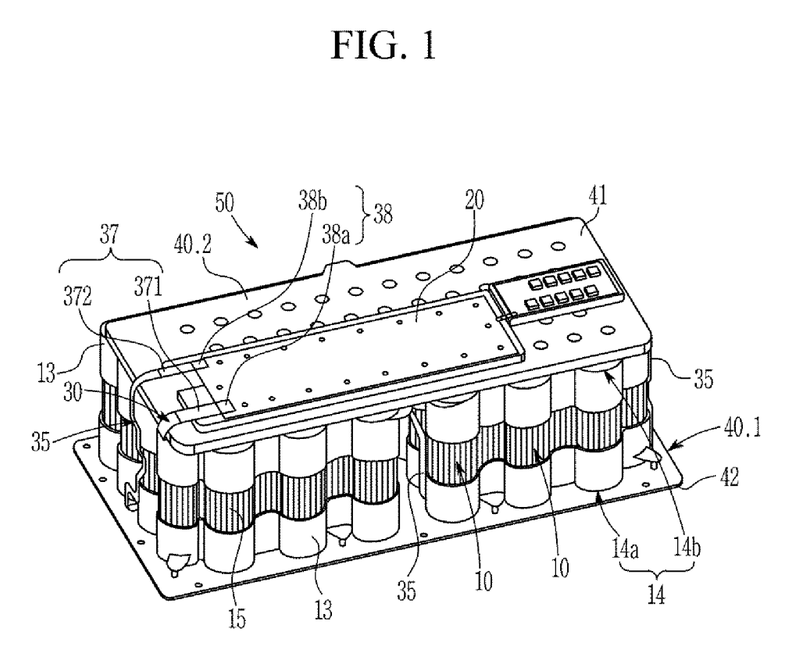
FIG. 1 is a perspective view of a battery module according to an embodiment.

FIG. 1 is a schematic perspective view of a battery module 50 according to an embodiment. The battery module 50 includes a plurality of cylindrical battery cells 10, each having a pair of opposing circular base surfaces 14, which are connected to each other by a lateral surface 15. Each of the battery cells 10 is disposed within a respective cell case 13. The cell case 13 includes (e.g., is divided into) an upper cell case and a lower cell case, and a central part of the lateral surface 15 of each of the battery cells 10 is not covered by the cell case 13 (e.g., the central part of the lateral surface 15 of the battery cells 10 is exposed between the upper cell case and the lower cell case of the cell case 13).

The plurality of battery cells 10 is disposed on a base plate 42, and the base plate 42 is configured as a lower heat exchanger 40.1 for transporting heat emitted by the battery cells 10 via their lower base surfaces 14a away. A top cover 41 is disposed on top of the plurality of battery cells 10 and is configured as an upper heat exchanger 40.2 for transporting heat emitted by the battery cells 10 via their upper base surfaces 14b away. On top of the top cover 41, a cell supervision circuit (CSC) 20 is provided, and the CSC 20 is configured to receive signals corresponding to the voltage and temperature of the battery cells 10 of the battery module 50. The CSC 20 is further configured to communicate with a battery management system and to control voltages of the battery cells 10 of the battery module 50 via active or passive balancing.

Figure 2:
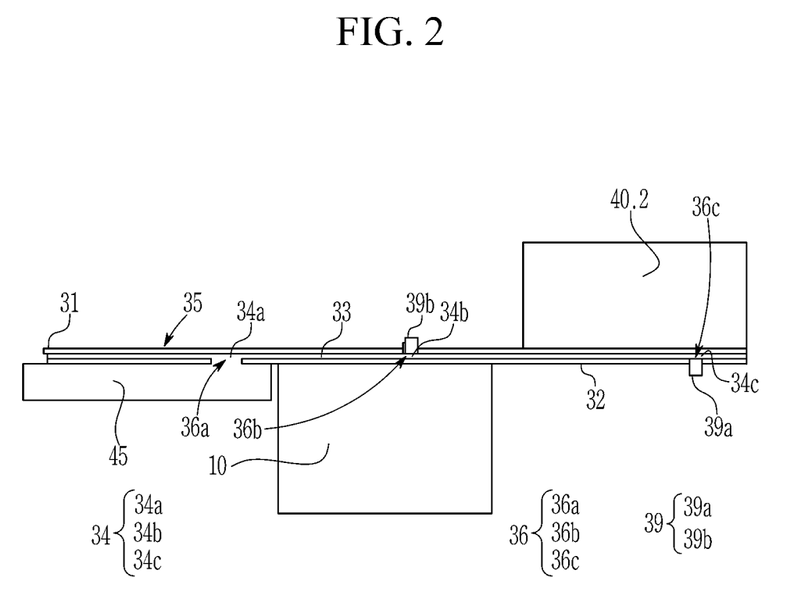
FIG. 2 is a schematic cross sectional view of a flexible printed circuit (FPC) of a flexible interconnector in the battery module shown in FIG. 1.

The battery module 50 further includes a flexible interconnector 30 with (or including) a strip-shaped flexible printed circuit (FPC) 35, a cross section of which is shown schematically in FIG. 2. The FPC 35 comprises a first insulating main surface 31 and a second insulating main surface 32 opposite to the first insulating main surface 31 (see, e.g., FIG. 2). A plurality of conducting lines 33 is disposed between the insulating main surfaces 31, 32 such that they are electrically and/or thermally insulated from the surroundings. As shown in FIG. 1, a first connection portion (e.g., a first terminal end) 371 of the FPC 35 (e.g., a first connecting portion 371 of both connecting portions 37 of the FPC 35) is connected to the CSC 20 via a first connector plug 38a (e.g., a first connector plug 38a of both connector plugs 38), and a second connection portion (e.g., a second terminal end) 372 of the FPC 35 (e.g., a second connecting portion 372 of both connecting portion 37 of the FPC 35) is connected to the CSC 20 via a second connector plug 38b (e.g., a second connector plug 38b of both connector plugs 38). The flexible interconnector 30 thus forms an electric loop starting and terminating at the CSC 20.

As further shown in FIG. 2, the conducting lines 33 of the FPC 35 include a plurality of contact portions 34a, 34b, 34c, in which (or at where) the conducting lines 33 are exposed by contact apertures 36a, 36b, 36c in the first insulating main surface 31 (in the case of the contact aperture 36b) or in the second insulating main surface 32 (in the case of the contact apertures 36a, 36c). For example, an electric and/or thermal connection can be established between the conducting line(s) 33 and an adjacent object at the contact portion 34a, 34b, 34c via the respective contact aperture 36a, 36b, 36c. By wrapping the FPC 35 around the battery module 50, voltages and/or temperatures at its constituents (e.g., of all or substantially all of the battery cells 10 therein) may be measured.

As illustrated in FIG. 1, the FPC 35 of the flexible interconnector 30 wraps around the battery module 50 and extends over various constituent elements thereof. Starting from the first terminal end 371, the FPC 35 is guided underneath the top cover 41 and between the battery cells 10, such as by going up and down between the battery cells 10 between the top cover 41 and the base plate 42. The FPC 35 then extends along a lower side of the base plate 42 and extends upwardly along one of the battery cells 10 towards the second terminal end 372 at the CSC 20. The FPC 35 includes a plurality of contact portions 34 along its extension length in electric and/or thermal contact with a plurality of measurement points of the battery module 50.

As shown in FIG. 2, the FPC 35 extends along a battery cell 10, a heat exchanger (e.g., the lower or upper heat exchanger 40.1, 40.2), and a busbar 45. At each of these components, one of the first and second main insulating surfaces 31, 32 has a contact aperture 36 exposing a contact portion 34 of a conducting line 33. In the FPC 35, different contact apertures 36 expose different conducting lines 33. For example, a first contact aperture 36a in the second insulating main surface 32 adjacent to a busbar 45 exposes a conducting line 33 that contacts the busbar 45 in the region of a first contact portion 34a. The conducting line 33 is electrically connected to the busbar 45 by, for example, soldering. A third contact aperture 36c in the second main insulating surface 32 is disposed near the upper heat exchanger 40.2 and exposes a third contact portion 34c. However, the upper heat exchanger 40.2 is adjacent to the first main insulating surface 31 such that no electric connection is established between the upper heat exchanger 40.2 and the conducting line 33. A thermistor 39a is disposed in the third contact aperture 36c; thus, the thermistor 39a is in the vicinity of the upper heat exchanger 40.2. The ohmic resistance of the thermistor (e.g., a negative temperature coefficient (NTC) thermistor) depends on the temperature of the thermistor 39a, and a voltage drop in the respective conducting line 33 is indicative of a temperature of the thermistor 39a. Another thermistor 39b is disposed in a second contact aperture 36b that exposes a second contact portion 34b and that is adjacent to and faces away from the battery cell 10. The voltage drop over the thermistor 39b is indicative of a temperature of the battery cell 10 (e.g., of the corresponding battery cell 10).

Figure 3:
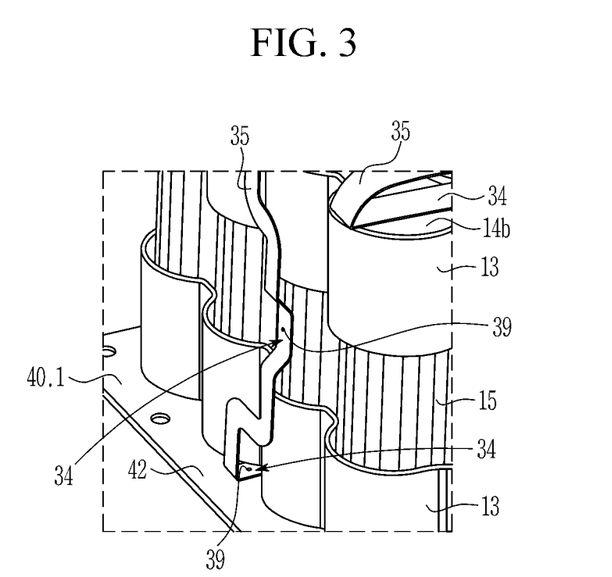
FIG. 3 is a schematic perspective view of part of a side surface of the battery module shown in FIG. 1.
Figure 4:
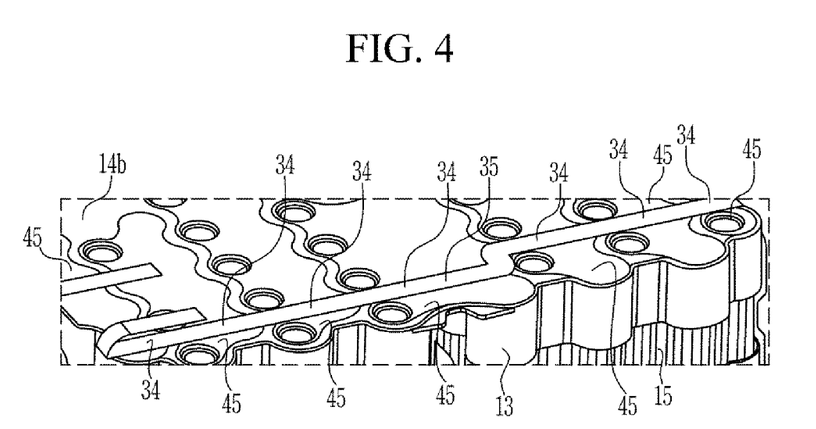
FIG. 4 is a schematic perspective view of a bottom surface of the battery module shown in FIG. 1.

As shown in FIG. 3, the FPC 35 is attached to a surface of the battery cells 10 to measure the temperatures thereof. For example, the FPC 35 is attached to a part of the lateral surface 15 of the battery cells 10 that is not covered by the cell case 13. The thermistor 39 (schematically represented by a dark dot) is disposed in the attachment portion of the FPC 35 and is thus influenced by the temperature of the nearby (e.g., corresponding) battery cell 10. The thermistor 39 is disposed in a contact aperture that exposes a contact portion 34 and that is adjacent to and faces away from the battery cell 10. The contact portion is exposed by the contact aperture on a side facing away from the battery cell 10 and the contact portion is covered on an opposite side facing toward the battery cell 10 by a portion of the second insulating main surface. The portion of the second insulating main surface covering the contact portion 34 contacts the lateral surface 15 of the battery cell 10. As shown in FIG. 4, the FPC 35 extends over a plurality of busbars 45 at the upper base surface 14b of the battery cells 10 to measure voltage. The FPC 35 includes the plurality of contact portions 34 respectively exposing other ones of the conducting lines 33. Some of the plurality of contact portions 34 are adjacent to and face towards one of the busbars 45. Some of the plurality of contact portions 34 contact respective busbars 45 and contact the upper base surface 14b of the battery cells 10 through the respective busbars 45. Hence, an electric connection is established between the respective conducting line 33 and the respective busbar 45, and hence, a voltage potential at the busbar 45 is provided via the corresponding conducting line 33 to a respective voltage measurement input at the CSC 20, for example, via a pin of a connector plug 38.

Figure 5:
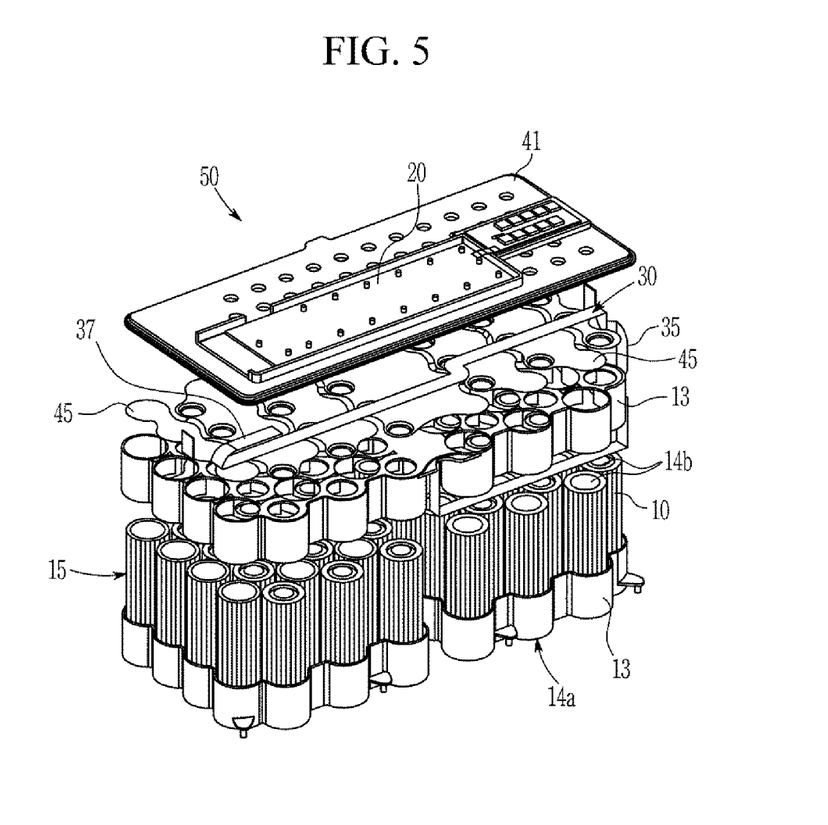
FIG. 5 is a schematic exploded view of the battery module shown in FIG. 1.

FIG. 5 is a schematic exploded view of the battery module shown in FIG. 1 with the base plate 42 omitted for ease of description. The cell cases 13 have openings that are aligned with the base surfaces 14 of the battery cells 10 to enable the battery cells 10 to contact other elements.

In FIG. 5, the second terminal end 372 of the FCP 35 and a portion of the FCP 35 between the second terminal end 372 and a middle portion of the FCP 35 connected to lateral surfaces 15 of the battery cells 10 are omitted for ease of description. The FCP 35 as illustrated in FIG. 5 extends underneath the top cover 41, along the outer lateral surfaces 15 of the battery cells 10, along the lower base surfaces 14a of the battery cells 10, and along the inner lateral surfaces 15 of the battery cells 10.

Figure 6A:
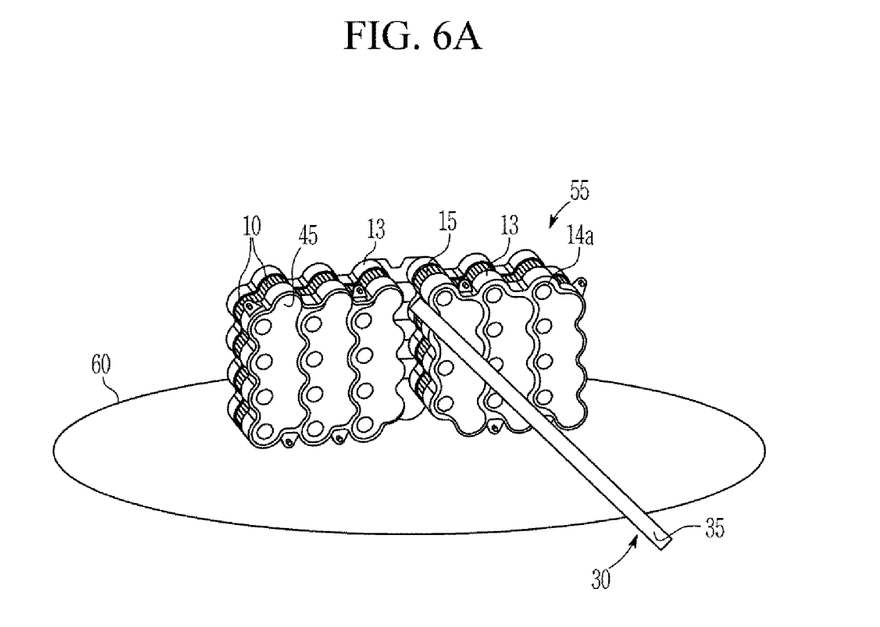

FIGS. 6(A) to 6(D) schematically illustrate steps of a method for manufacturing a battery module 50 according to an embodiment. As shown in FIG. 6(A), a pre-module 55 is provided that includes a plurality of cylindrical battery cells 10 disposed in two-part cell cases 13 as described above. At the lower and upper base surfaces 14a, 14b of the battery cells 10, the terminals of the battery cells 10 are interconnected in parallel and/or in series via a plurality of busbars 45. The plurality of aligned battery cells 10 have surfaces in different orientations, for example, the lateral surfaces 15 of the aligned battery cells 10 face in different orientations. The pre-module 55 is disposed on a table (e.g., a rotatable table) 60 that is configured to be rotated during the manufacturing method.

As further shown in FIG. 6(A), a terminal end of a flexible interconnector 30 is attached to the pre-module 55 via a self-adhesive portion thereof that is adhered to the pre-module 55 via, for example, a robot arm of a feeding machine. Therein, the flexible interconnector 30 includes the strip-shaped FPC 35 as described above with a first insulating main surface 31, a second insulating main surface 32 opposite the first insulating main surface 31, and a plurality of thermally and/or electrically conducting lines 33 disposed between the first insulating main surface 31 and the second insulating main surface 32. Further, each conducting line 33 includes at least one contact portion 34 that is exposed by (or exposed through) a contact aperture 36 in the first insulating main surface 31 or the second insulating main surface 32.

Figure 6B:
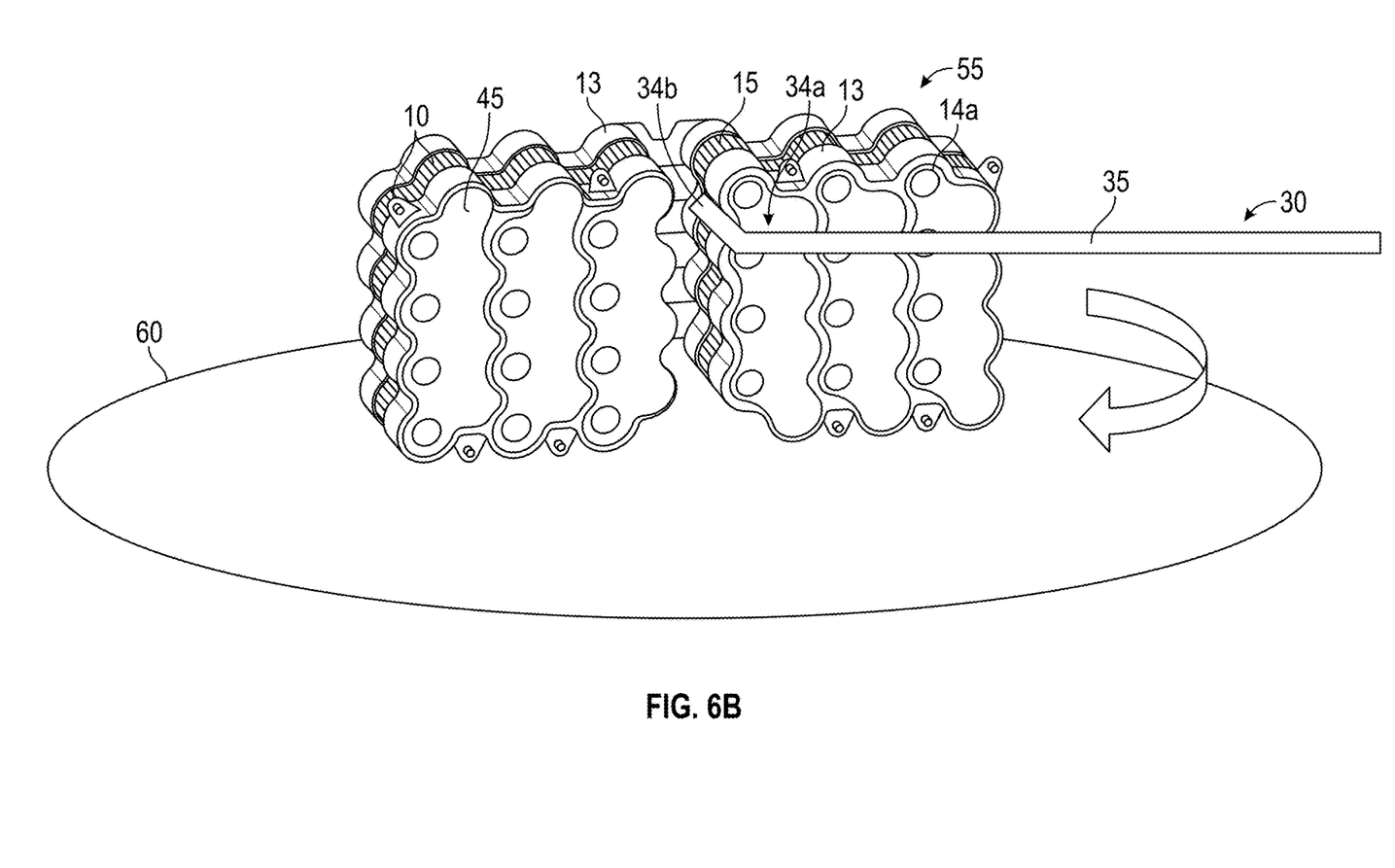
Figure 6C:
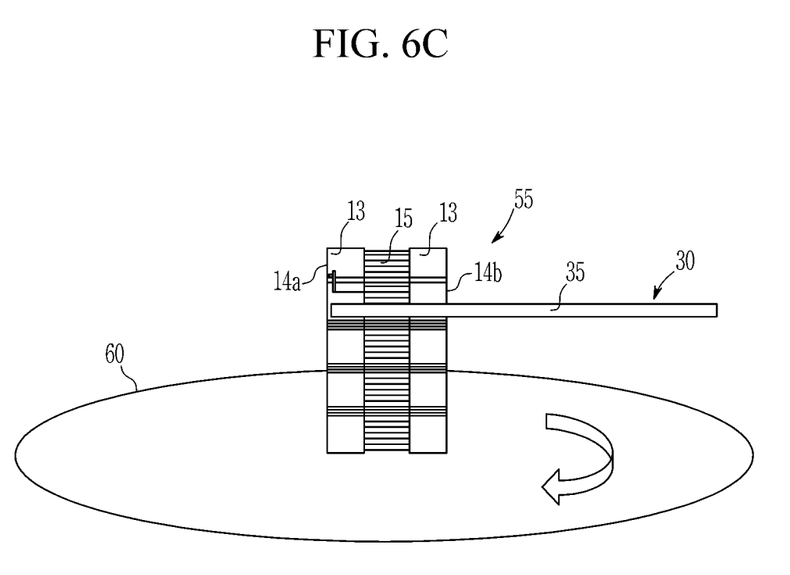
Figure 6D:
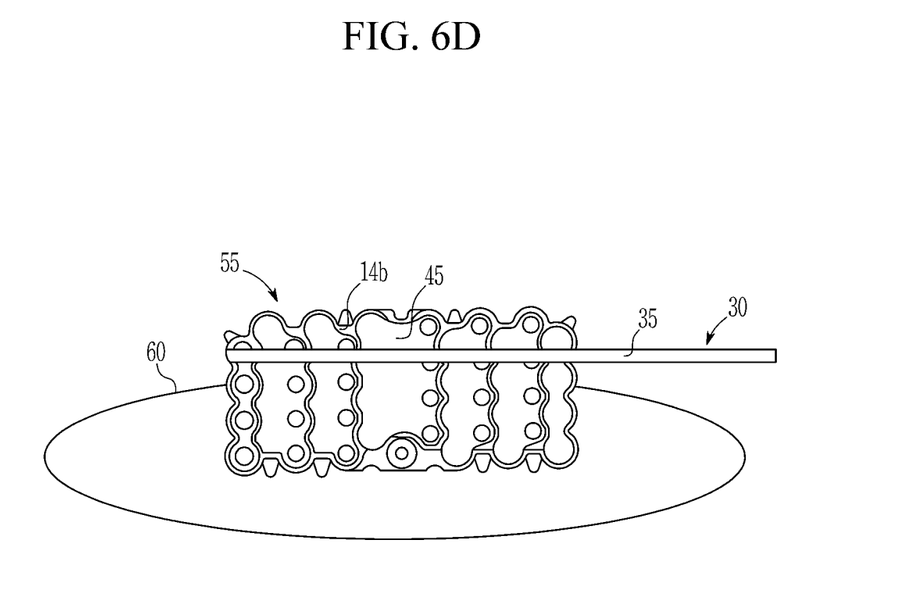

As show in FIGS. 6(B) to 6(D), after attachment of the terminal portion of the flexible interconnector 30, the rotatable table 60 starts to spin while the flexible interconnector 30 is kept under tension by the robot arm of the feeding machine. As the rotatable table 60 spins, the flexible interconnector 30 is wrapped around the pre- module 55 such that the contact portions 34 contact different surfaces at different orientations of the battery module 50. A plurality of busbars 45 disposed on lower base surfaces 14a of the battery cells 10 is contacted by the flexible interconnector 30, for example, by a plurality of the respective contact portions 34 that are exposed by respective contact apertures 36, as shown in FIG. 6(B). For example, the first contact portion 34a and the second contact portion 34b may be exposed by respective contact apertures as shown in FIG. 6(B). Further, the lateral surfaces 15 of the battery cells 10 contact respective contact portions 34 for temperature measurements as shown in, for example, FIG. 6(C). Further, respective contact portions 34 of the flexible interconnector 30 contact a plurality of busbars 45 disposed on the upper base surfaces 14b of the battery cells 10 for connecting them to respective conducting lines 33 as shown in FIG. 6(D). These conducting lines 33 can then be connected to respective voltage measurement pads of the cell supervision circuit 20.

After the flexible interconnector 30 is wrapped around the pre-module 55, the electric connections between the contact portions 34 of the wrapped flexible interconnector 30 and at least one of the differently oriented surfaces of the battery cells 10, at least one heat exchanger 40.1, 40.2, and at least one busbar 45 are provided by welding and/or soldering. Hence, the conducting lines 33 are connected to the adjacent component of the pre-module 55 in the region of the contact portion 34 and via the contact aperture 36. Then, the CSC 20 is attached to the pre-module 55 to form the battery module 50, and a connector plug 38 at a terminal end of the flexible interconnector 10 is connected to the CSC 20.

The electronic or electric devices and/or any other relevant devices or components according to embodiments of the present invention described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips.

Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a ROM, flash drive, or the like. Also, a person of skill in the art should recognize that the functionality of various computing devices may be combined or integrated into a single computing device, or the functionality of a particular computing device may be distributed across one or more other computing devices without departing from the scope of the invention's embodiments.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification and should not be interpreted in an idealized or overly formal sense, unless expressly defined so.

SOME REFERENCE NUMERALS 10 battery cell
13 cell case
14 base surface
14a lower base surface
14b upper base surface
15 lateral surface
20 cell supervision circuit (CSC)
30 flexible interconnector
31 first insulating main surface
32 second insulating main surface
33 conducting lines
34 contact portion
34a first contact portion
34b second contact portion
34c third contact portion
35 strip-shaped flexible printed circuit (FPC)
36 contact aperture
36a first contact aperture
36b second contact aperture
36c third contact aperture
37 connecting portion
371 first connecting portion
372 second connecting portion
38 connector plug
39 thermistor
40.1 lower heat exchanger
40.2 upper heat exchanger
41 top cover
42 base plate
45 busbar
50 battery module
55 pre-module
60 rotating table

What is claimed is:
1. A battery module comprising:
a plurality of aligned battery cells, each of the battery cells having two opposite- facing base surfaces and a lateral surface extending between the two opposite-facing base surfaces;
a cell supervision circuit (CSC) configured to receive signals corresponding to the voltage and/or temperature of at least one of the battery cells; and
a flexible interconnector wrapping around the plurality of aligned battery cells, the flexible interconnector comprising a strip-shaped flexible printed circuit (FPC), the strip-shaped FPC comprising a first insulating main surface, a second insulating main surface opposite the first insulating main surface, and a plurality of thermally and/or electrically conducting lines between the first insulating main surface and the second insulating main surface; and a plurality of busbars, each busbar of the plurality of busbars contacting one of the two opposite-facing base surfaces of at least one of the battery cells of the plurality of aligned battery cells, wherein a first one of the plurality of thermally and/or electrically conducting lines of the flexible interconnector has:

a second contact portion exposed by a contact aperture in the first insulating main surface and covered, on its opposite side, by a portion the second insulating main surface, the portion of the second insulating main surface contacting the lateral surface of a first battery cell of the plurality of aligned battery cells; and a connecting portion for connection to the CSC, and wherein a second one of the plurality of thermally and/or electrically conducting lines of the flexible interconnector has:

a first contact portion exposed by a contact aperture in the second insulating main surface and covered, on its opposite side, by the first insulating main surface, the first contact portion over one of the two opposite-facing base surfaces of the first battery cell, the first contact portion contacting a first busbar of the plurality of busbars and contacting one of the two opposite-facing base surfaces of the first battery cell through the first busbar; and a connecting portion for connection to the CSC.

2. The battery module according to claim 1, wherein the plurality of aligned battery cells are cylindrical battery cells.

3. The battery module according to claim 1, further comprising a heat exchanger in thermal contact with the plurality of aligned battery cells, wherein a third one of the plurality of thermally and/or electrically conducting lines of the flexible interconnector has:

a third contact portion exposed by a contact aperture in the second insulating main surface and covered, on its opposite side, by the first insulating main surface, the third contact portion contacting the heat exchanger; and a connecting portion for connection to the CSC.

4. The battery module according to claim 1, wherein each of the busbars of the plurality of busbars are interconnecting cell terminals of at least two of the battery cells.

5. The battery module according to claim 1, wherein the connecting portions of at least some of the conducting lines are arranged at a terminal end of the strip-shaped FPC.

6. The battery module according to claim 5, wherein each one of the plurality of thermally and/or electrically conducting lines extends across the entire length of the strip-shaped FPC, and wherein each one of the plurality of thermally and/or electrically conducting lines has a first connecting portion at a first terminal end and a second connecting portion at a second terminal end.

7. The battery module according to claim 5, wherein the flexible interconnector further comprises a connector plug attached to the terminal end of the strip-shaped FPC, the connector plug being connected to at least one of the plurality of thermally and/or electrically conducting lines and being configured to be electrically connected to the CSC.

8. The battery module according to claim 1, wherein connecting portions of at least some of the plurality of thermally or electrically conducting lines are arranged at a center part of the strip-shaped FPC.

9. The battery module according to claim 1, wherein each of the contact apertures exposes one or more of the plurality of thermally or electrically conducting lines.

10. The battery module according to claim 1, wherein a first subset of the plurality of thermally or electrically conducting lines is configured to measure electric voltages at respective contact portions, and wherein a second subset of the plurality of thermally or electrically conducting lines is configured to measure temperatures at respective contact portions.

11. The battery module according to claim 10, further comprising thermistors at the respective contact portions of the second subset of one the plurality of thermally or electrically conducting lines.

* * * * *